(12) United States Patent
Frei

(10) Patent No.: US 7,880,558 B2
(45) Date of Patent: Feb. 1, 2011

(54) METHOD AND APPARATUS FOR ADJUSTING LOAD IMPEDANCE OF A DISTRIBUTED AMPLIFIER

(75) Inventor: Jeffrey A. Frei, Hawthorn Woods, IL (US)

(73) Assignee: Motorola, Inc., Schaumburg, IL (US)

(*) Notice: Subject to any disclaimer, the term of this patent is extended or adjusted under 35 U.S.C. 154(b) by 224 days.

(21) Appl. No.: 12/201,208

(22) Filed: Aug. 29, 2008

(65) Prior Publication Data

US 2010/0052809 A1   Mar. 4, 2010

(51) Int. Cl.
*H03H 7/38*   (2006.01)
(52) U.S. Cl. .......................................... 333/32; 333/33
(58) Field of Classification Search .................... 333/32, 333/33
See application file for complete search history.

(56) References Cited

U.S. PATENT DOCUMENTS

| 5,920,230 | A | 7/1999 | Beall |
| 6,597,242 | B2 | 7/2003 | Petz et al. |
| 6,614,307 | B1 | 9/2003 | Zhao et al. |
| 7,173,502 | B2 | 2/2007 | Hosoya et al. |
| 7,706,756 | B2 * | 4/2010 | Sato et al. ...................... 455/78 |

OTHER PUBLICATIONS

Related PCT/US2009/053321—International Search Report with Written Opinion mailed Mar. 22, 2010—10 pages.

* cited by examiner

*Primary Examiner*—Stephen E Jones
(74) *Attorney, Agent, or Firm*—Barbara R. Doutre

(57) ABSTRACT

The application discloses a method and apparatus for adjusting internal load impedances, by section, at feed points present on a distributed amplifier's output transmission line. The method includes determining a summing-point load impedance ($Z_x$) at an off-chip output transmission line of the distributed amplifier. The method further includes determining a driving-point load impedance ($Z_d$) at an output of an on-chip power transistor. The driving-point load impedance diverges and disperses over frequency from that summing-point load impedance due to reactance of at least one on-chip component coupled to the output of the on-chip power transistor. The method then includes determining and providing an offset to summing-point load impedance ($Z_x$) based on the driving-point load impedance ($Z_d$) such that the driving-point load impedance ($Z_d$) converges to the summing-point load impedance ($Z_x$) of that distributed amplifier section.

12 Claims, 6 Drawing Sheets

US 7,880,558 B2

METHOD AND APPARATUS FOR ADJUSTING LOAD IMPEDANCE OF A DISTRIBUTED AMPLIFIER

FIELD OF THE DISCLOSURE

The present disclosure relates generally to distributed amplifiers and more particularly to a method and apparatus for adjusting summing point impedances on an output section of a distributed amplifier.

BACKGROUND

Typically, a distributed amplifier is a simple but uniquely architected structure that fundamentally enables a broadened frequency of operation when compared to conventional architectures. Historically, distributed amplifiers tend to suffer in having limited output power capability or relatively low efficiency. Physical implementation of distributed amplifiers may be 1) on a printed circuit board (PCB) with discrete transistors, 2) completely internal to an integrated circuit (IC) package, or 3) a combination of these. The distributed amplifier can be viewed as having an input transmission line acting as a radio frequency (RF) input signal path, and an output transmission line for collecting and summing amplified RF signal components. The distributed amplifier embeds amplification sections connected between the input and output transmission lines for amplifying RF energy associated with the RF signal. The amplification section consists of several transistors or power-transistors periodically suspended between the input and output transmission lines.

In general, an input RF signal is supplied to a section of transmission line connected to an input of a first power transistor. As the input RF signal propagates along the input transmission line, the individual power transistors amplify the RF signal samples, and re-apply their amplified signal component to be collected and summed in the proper additive phase on the output transmission line. Thus, the energy continues to build on the output transmission line segments. If the application is a so-called high power distributed amplifier (DA), the currents in these interconnecting branches may become too high for a fully on-chip implementation. The passive segments or interconnects may have to reside on a PCB rather than in an IC.

As alluded, the distributed amplifiers may require the passive segments of the output transmission line to be on PCB, or namely, off-chip. This is more likely when the goal is to create a large signal or power-amplifier as opposed to a small-signal distributed amplifier. As described above, in the case of the power distributed amplifier, the amplified RF signal at each output power-transistor-section may be brought off-chip before connecting to a corresponding feed-point, tap-point, or summing-point on the output transmission line. Thus, the output power contribution at these locations bridges the on-chip/off-chip boundary at each power transistor. This can solve a dissipation problem in the output transmission line, but creates a new problem as well. Namely this approach distorts the locus or set of best load impedances presented to each constituent power transistor. This distortion is due to undesired parasitic-loading effects by presence of chip boundary or packaged transistor boundary, which is coupled to the output of the power transistor in this case. This distortion, made up of impedance-displacement and dispersion over frequency, mismatches the output impedance loading of the power transistors, which in-turn, likely degrades the performance of the distributed amplifier.

Thus, there is a need to compensate the load impedance at the feed-points, tap-points or summing points of a distributed amplifier that uses an off-chip output transmission line.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
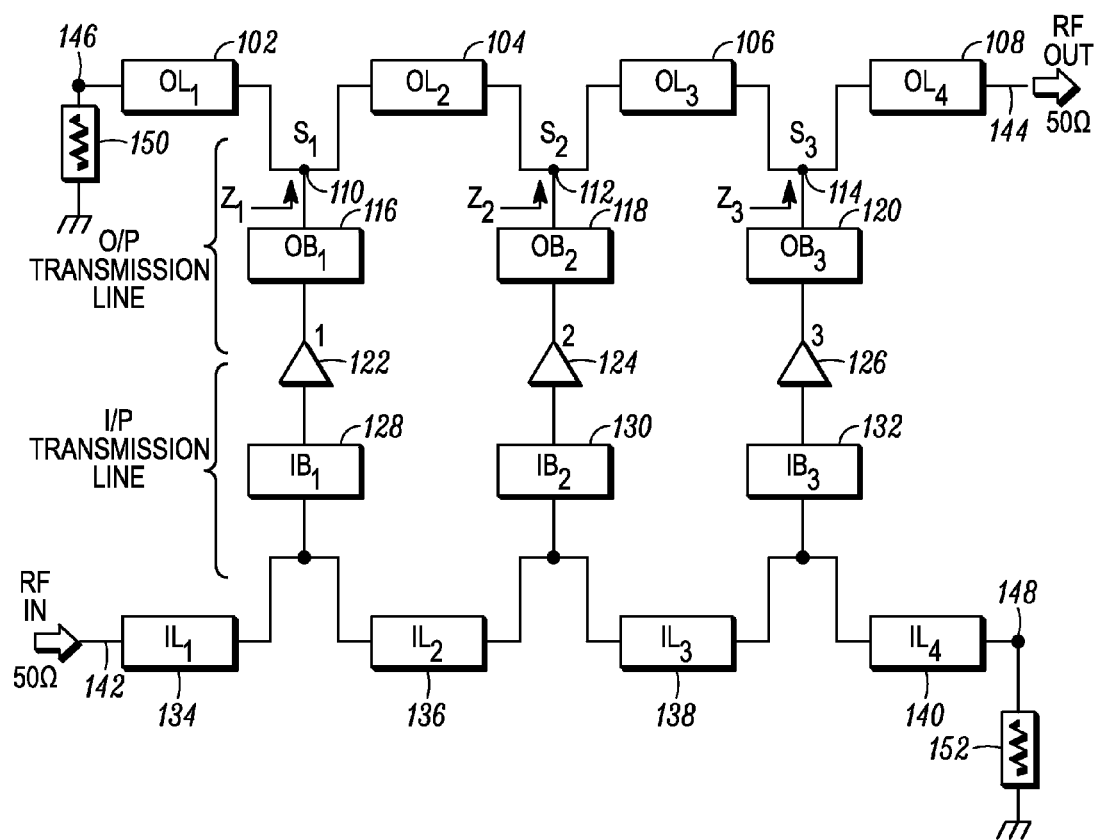
FIG. 1 illustrates a schematic circuit diagram of a distributed amplifier in accordance with an embodiment of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

The present disclosure is directed towards a method for adjusting a load impedance at a feed point present on the output side of a distributed amplifier. The method includes determining a load impedance, usually broadband, at a location on the off-chip output transmission line of the distributed amplifier. The method further includes determining a driving-point load impedance currently present at an output of an on-chip power transistor. The driving-point load impedance is diverged and dispersed over frequency from the summing-point load impedance available at the tap point or summing point on the output transmission line. This is due to reactance of at least one on-chip component coupled to the output of the on-chip, or individually packaged, power transistor. The method then includes providing an offset to the summing-point load impedance based on the transistor or driving-point load impedance such that the driving-point load impedance converges to, converges toward, or closely mimics the summing-point load impedance that is available on the output transmission line.

FIG. 1 illustrates a schematic circuit diagram of a distributed amplifier 100 that is capable of amplifying a broad range of frequencies in accordance with an embodiment of the invention. The distributed amplifier 100 may be a high power version implemented in a broad array of application areas such as portable radio, mobile radio, and cognitive radio transmitters or receivers. General purpose use such as a driver or common driver of yet higher powered amplifier stages may embody the distributed amplifier of the present invention. Providing a broad frequency range of amplification makes the distributed amplifier of interest to military systems in accordance with the embodiment of the invention.

The distributed amplifier 100 includes an input transmission line 142 consisting of a series of at least one of inductive elements or microstrip transmission lines 134,136,138,140, an output transmission line 144 composed of a series of at least one of inductive elements or microstrip lines 102,104, 106,108, or an L-C structure, an optimal reverse wave matching port 146 on the output transmission line 144 having an image matching impedance. A DC drain bias source 150, connected to ground, can feed the output line in various locations. An input wave matching port 148 on the input transmission line 142, having an image matching impedance, is connected to DC gate bias source 152 connected to ground, and a series of power transistors 122, 124, 126 suspended in the structure, as shown in FIG. 1, between the input and output transmission lines 142, 144.

In accordance with the embodiment, an output terminal of each power transistor is connected by an output block (OB) 116, 118, 120 to junction, tap, or summing nodes or feed points between the microstrips 102, 104, 106, 108 of the output transmission line 144. An input terminal of each power transistor is connected by an input block (IB) 128, 130, 132 to similar junction nodes between the microstrips 134, 136, 138, 140 of the input transmission line 142. The input and output blocks are implemented to optimize how energy is split and re-combined within the entire structure.

Further, the distributed amplifier 100 includes summing points $S_1$, $S_2$, $S_3$ at corresponding feed points 110, 112, 114 for adding the amplified radio frequency (RF) signals from each transistor, resulting in a higher power amplified RF signal at the output of the entire distributed amplifier 100. Impedances at these summing points $S_1$, $S_2$, $S_3$ are referred to summing-point load impedance $Z_1$, $Z_2$, $Z_3$. The impedance $Z_x$ (x=1, 2, 3 . . . n) at the summing point $S_x$ (x=1, 2, 3 . . . n) in a optimally tapered distributed amplifier 100 can produce a very broadband load impedance. The summing-point load impedance $Z_x$ enables the distributed amplifier structure 100 to periodically load the power transistors in an optimal broad manner improving the overall effectiveness of power amplification in the distributed amplifier 100.

In accordance with the embodiment, the radio frequency (RF) signals are sent through the input transmission line 142 of the distributed amplifier (DA) 100. As the input RF signal propagates along the input transmission line 142, each individual power transistor amplifies the RF signal samples and forward these amplified RF signal components to the corresponding summing point on the output transmission line. The energy builds on the output transmission line due to contributions taking place at each summing point $S_x$.

Further, since DA 100 is capable of amplifying a broad range of frequencies, the summing-point load impedance $Z_x$, is maintained as broad as possible, through overall design optimization, so as to drive a constant load to the power transistors. This, in-turn, improves the performance of DA 100. However, the summing-point load impedance $Z_x$ may be further or additionally diverged and dispersed (relocated and spread out) across frequency when it is transformed to a driving-point or load point of the transistor, due to probable, undesired, parasitic affects stemming from on-chip components in the output block (OB) 116, 118, 120 coupled to the output of the corresponding transistor. As soon as there is a boundary such as an interface between on-chip to off-chip, these parasitics have been created. Thus, in order to recover or mimic the summing-point load impedances at the driving-point of each power transistor, an intelligent pre-distort (the IP) block is also introduced into each output block (OB) 116, 118, 120 of the distributed amplifier 100.

Figure 2:
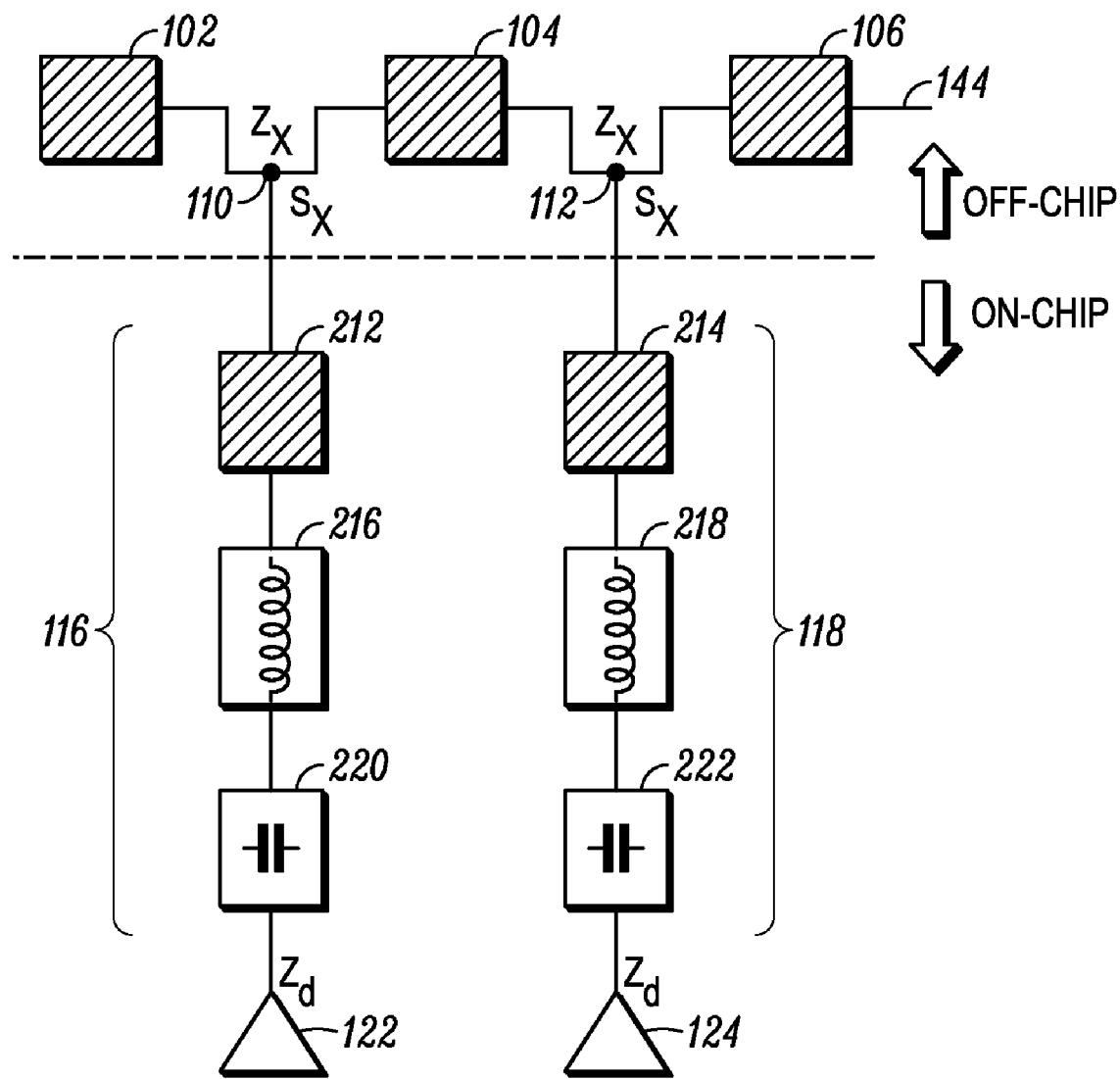
FIG. 2 illustrates a portion of a schematic circuit diagram of a distributed amplifier having an off-chip output transmission line structure in accordance with an embodiment of the invention.

FIG. 2 illustrates a portion of a schematic circuit diagram of a distributed amplifier having off-chip output transmission line 144 in accordance with an embodiment of the invention. For simplicity, only two sections of the schematic circuit diagram of FIG. 1 are considered. It is to be noted that the process is applicable to each power transistor leg of the distributed amplifier. In FIG. 2, an exploded view of the output block (OB) of FIG. 1 is shown, for example, the on-chip components 212, 216, 220 are connected in series and are constituents within the output block 116 of FIG. 1, while on-chip components 214,218,222 are constituents within the output block 118.

In one embodiment, the undesired parasitic affects are made up of at least several items. The on-chip components 212, 214 are transmission line components that may act capacitively in a high impedance setting. Similarly, the on-chip components 216, 218 are inductive components providing a given inductive reactance to the load, and the on-chip components 220, 222 are capacitive components providing a given capacitive reactance to the net loading of the power transistors 122, 124.

In accordance with the embodiment, the distributed amplifier includes, at least, an off-chip output transmission line 144. In FIG. 2, a dotted line indicates the separation of on-chip and off-chip portions of the distributed amplifier. In one embodiment, FIG. 2 may also represent a distributed amplifier with no chip at all, and the power transistors 122, 124 are each individually packaged. For clarity, the input transmission line 142 and the input blocks 128-132 of FIG. 1 are not shown in FIG. 2. The power transistors 122, 124 and critical boundary-components 212-222 are positioned within a package: IC or otherwise. On the other hand, the output transmission line 144 having a series of microstrip elements 102, 104, 106 is positioned off-chip or outside of packaging. In one embodiment, positioning the output transmission line 144 outside the package prevents over heating of the output transmission line 144 due to high RF currents at the output of power transistors 122, 124.

Further, since the output transmission line 144 is brought off-chip, the high power amplified RF signal, from each power transistor, is brought off-chip before summing or connecting to the feed point 110, 112 of the output transmission line 144. Bringing the high power RF signal outside the package, or off-chip, may prevent destruction of the output transmission line 144. However, bringing the RF signal from on-chip to off-chip repeatedly may disturb the set of transformed driving-point load impedances $Z_d$, resulting in power transistor mismatch. This implies divergence from the summing-point load impedance $Z_x$ of the distributed amplifier 200. Further, due to this mismatch, the power transistor may drive a highly frequency-dispersed load, which in-turn degrades the performance of the distributed amplifier 200, which could be broadband in nature. Thus, an intelligent pre-distort block (not shown) is introduced between the summing points 110, 112 and the corresponding on-chip components 212, 214 to maintain a more frequency-consistent driving-point load impedance $Z_d$, and converging to the summing-point load impedance $Z_x$, at the output of the power transistors 122, 124.

Figure 3:
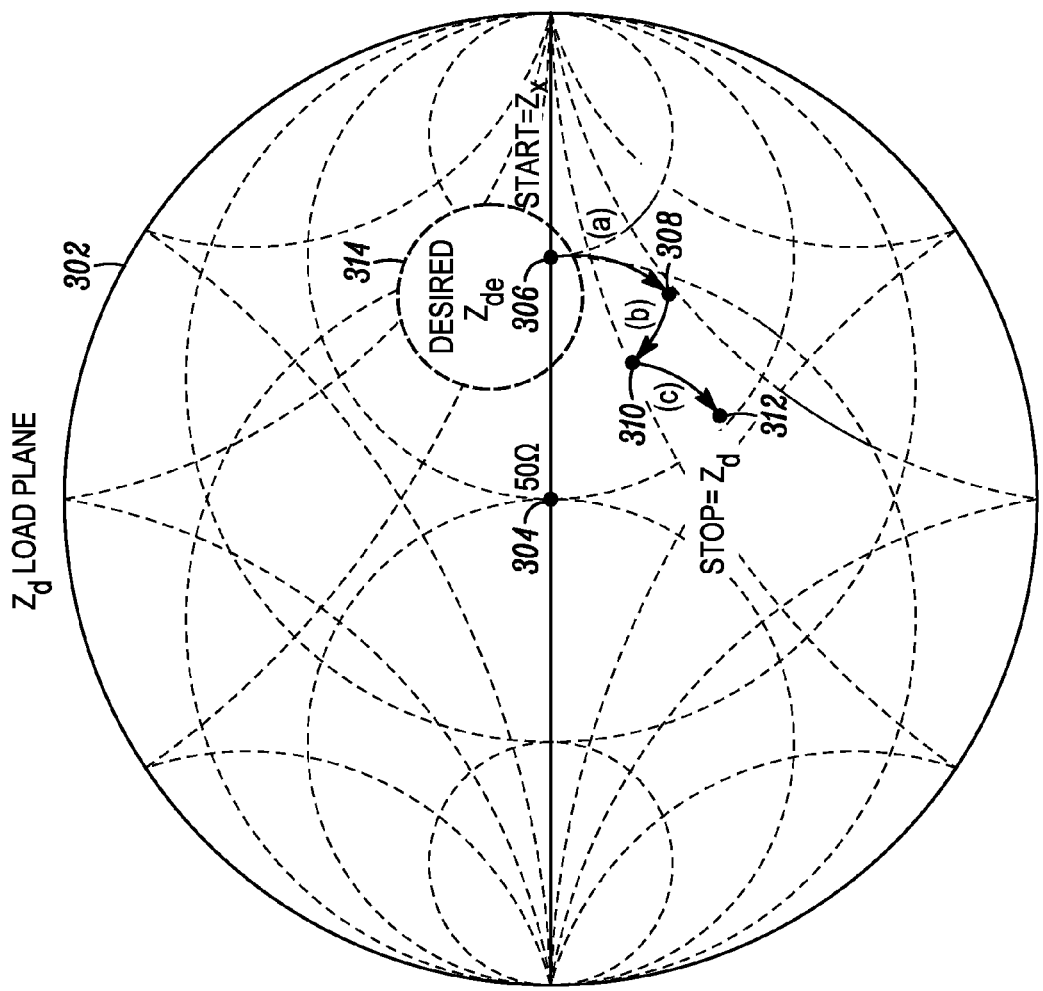
FIG. 3 is a graph illustrating a cumulative shift of the summing-point load impedance by virtue of the existence off-chip/on-chip boundary, and due to on-chip components or parasitics in accordance with an embodiment of the invention.

FIG. 3 is a graph illustrating the trajectory movement of summing-point load impedance $Z_x$ due to distortion from so called 'undesired' on-chip components in accordance with an embodiment of the invention. For simplicity, FIG. 3 depicts the graph of one section of the distributed amplifier 200 having a power transistor 122, on-chip components 212, 216, 220, and the feed point 110 of FIG. 2. It is to be noted that the graph is not limited to only one power transistor 122, and is applicable to each power transistor of the distributed amplifier. FIG. 3 indicates the graph of a load plane 302, in which one typically desired impedance locus ($Z_{de}$) for an ideal distributed amplifier is represented as a dotted circle 314.

In accordance with the embodiment, the load plane indicates a summing-point load impedance $Z_x$, as a much converged locus over frequency or starting point 306. Movement for only one frequency is shown. For example, the impedance at this point 306 is several hundred ohms and consistent over frequency much like a conventional ordinary system impedance of 50 ohms at a point 304. Further, due to capacitive reactance of the transmission line component 212 or 214, the summing-point load impedance $Z_x$ is distorted or displaced and moves down to a point 308 that is below the locus point 306. Since the reactance is a mostly capacitive reactance, a line between the points 306 and 308 moves in a clock wise direction bringing the summing-point load impedance further away from the desired impedance 314. This movement indicates an offset or shift in the impedance value of the summing-point load impedance $Z_x$. Further, as the shifted summing-point load impedance is evaluated even closer to the transistor, it experiences another offset due to inductive reactance of the on-chip inductive component 216 connected in series to the transmission line component 212. This offset moves the summing-point load impedance $Z_x$, in an inductive direction, from the point 308 to a point 310 in the load plane 302.

As the summing-point load impedance $Z_x$ is further transformed, it experiences another disruption or displacement due to capacitive reactance of the capacitive component 220 connected between the inductive component 216 and the power transistor 122. Thus, the summing-point load impedance is further shifted more-capacitive or downward reaching the point 312 of load plane 302. The point 312 is a stop point that is also known as the driving-point in FIG. 2. The final shifted summing-point load impedance at the driving-point is represented as the driving-point load impedance $Z_d$ which is mismatched with the summing-point load impedance $Z_x$ determined at the feed point of the transmission line. Thus, as the summing-point load impedance is brought into the packaging, i.e., from off-chip to on-chip, the summing-point load impedance is degraded via divergence and dispersement over frequency, known as distortion, from the contributions of on-chip components 212, 216, 220.

Figure 4:
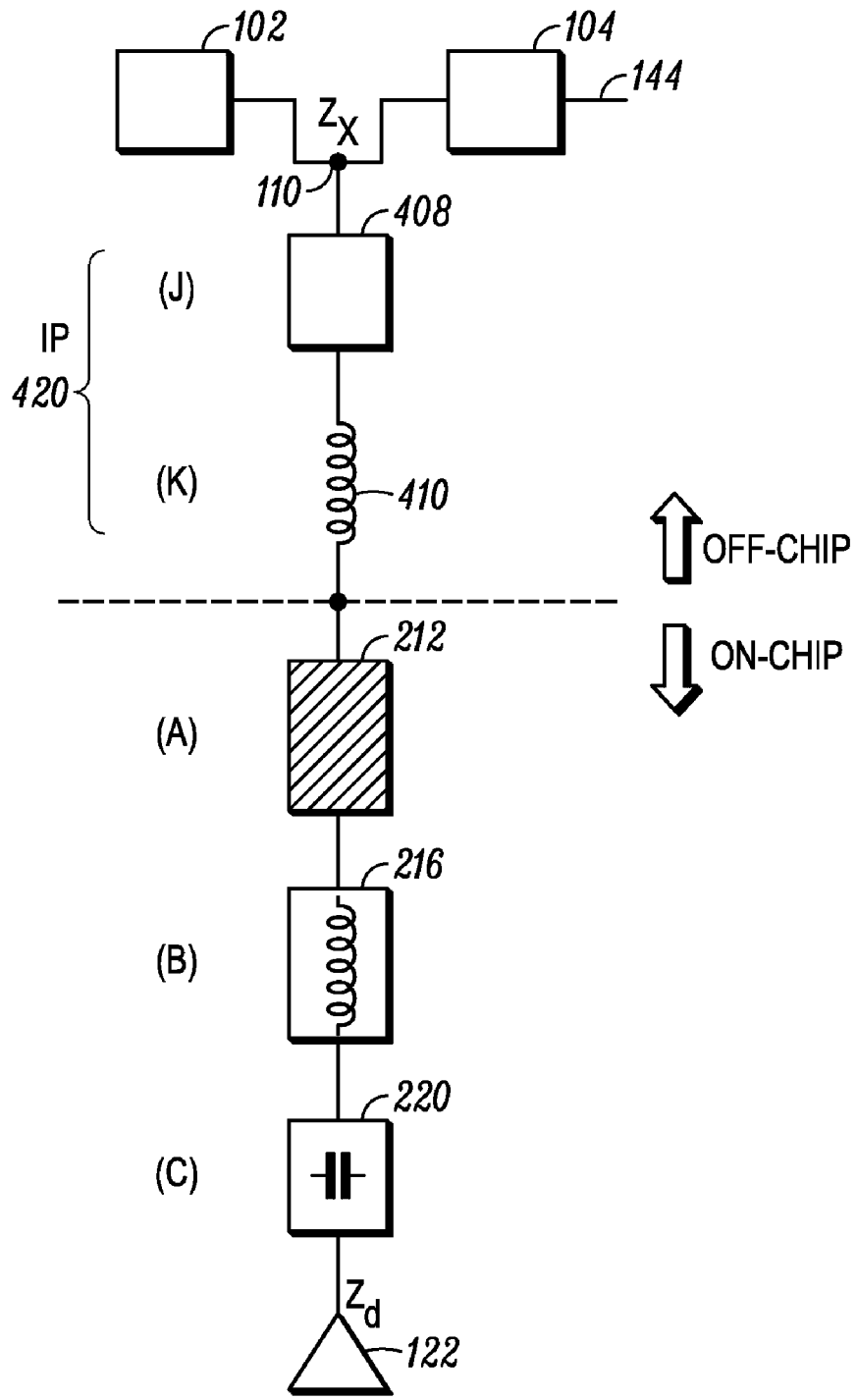
FIG. 4 illustrates a portion of a schematic circuit diagram of a distributed amplifier having an additional, new, off-chip intelligent pre-distortion (IP) component in accordance with an embodiment of the invention.

Therefore, to maintain the consistent summing-point load impedance at the driving-point of the power transistor, an off-chip IP block is introduced at the output transmission line as shown in FIG. 4.

FIG. 4 illustrates a portion of a schematic circuit diagram 400 of a distributed amplifier having off-chip IP component 420 in accordance with an embodiment of the invention. Output transmission line 144 includes a series of microstrip elements 102, 104 positioned off-chip and coupled to a feed point 110. The IP component includes an illustrated transmission line component 408 and an inductive component 410. The transmission line component may also be a microstrip stub, a shunt chip-C, or any similar component that provides a predetermined capacitive reactance. One end of the transmission line component 408 is connected to a feed point or junction node of the output transmission line 444, and the other end of the transmission line component 408 is connected to the inductive component 410. The inductive component 410 may be any component that provides a predetermined inductive reactance. The inductive component 410 is further connected to the on-chip or in-package series coupled components 212, 216, 220, and then to the power transistor 122. The performance of the IP block is described in detail with reference to a graph shown in FIG. 5 utilizing references (A)(B)(C), and (J)(K) representing the components 212, 216, 220, and 408, 410 respectively.

Figure 5:
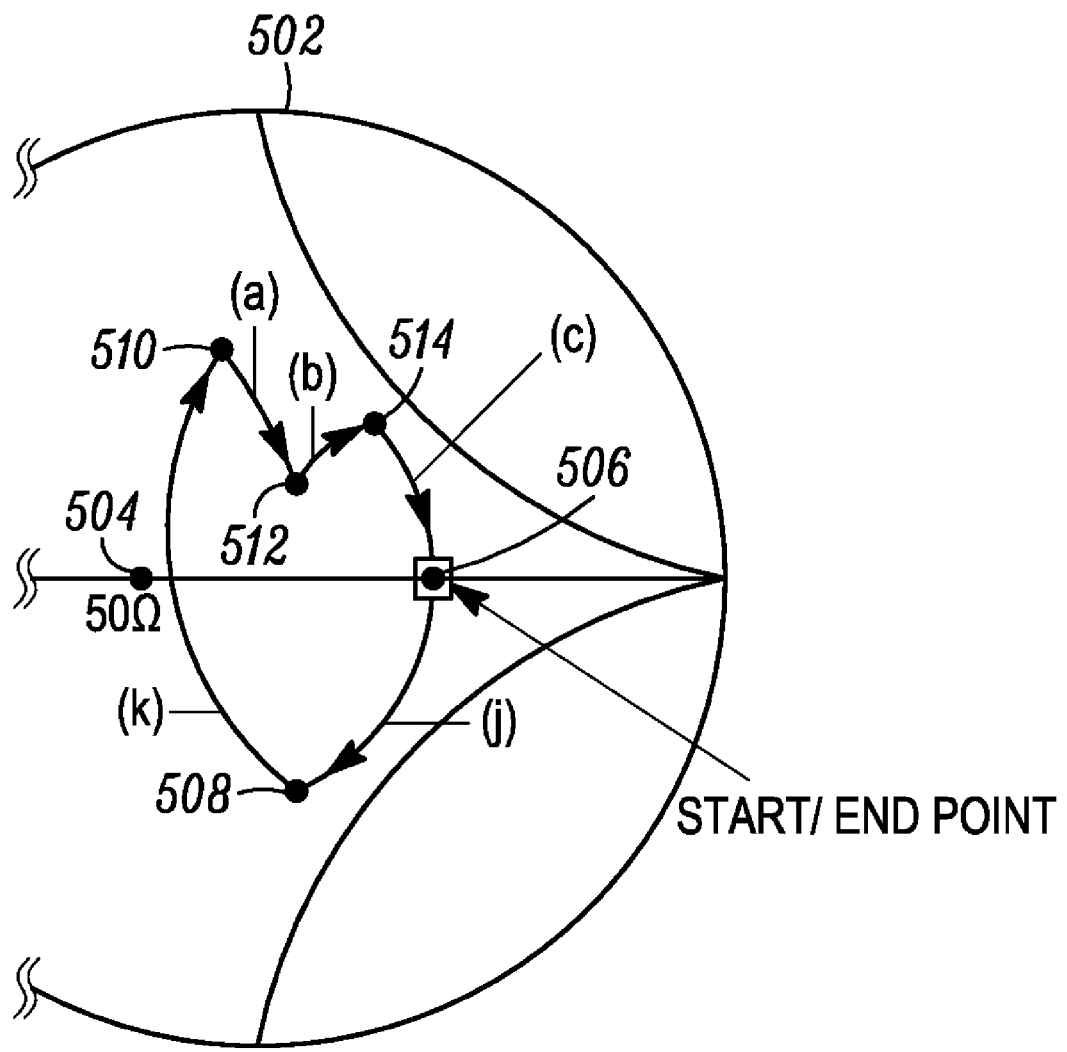
FIG. 5 is a graph illustrating the total cumulative trajectory of summing-point load impedance due to incorporation of the intelligent pre-distortion (IP) block in accordance with an embodiment of the invention.

FIG. 5 is a graph illustrating the trajectory of the summing-point load impedance $Z_x$ as traversal is made to driving point impedance $Z_d$. The pre-distortion of off-chip component or IP block is shown in accordance with an embodiment of the invention. Also shown are the affects of the generalized on-chip parasitics that the pre-distortion was designed to work with. It is to be noted that the graph 500 is described with reference to the schematic diagram of FIG. 4.

In accordance with the embodiment, the load plane 502 indicates the summing-point load impedance $Z_x$, at a locus point or starting point 506. For example, the impedance at this point 506 is high compared to the normal impedance of 50 ohms at a point 504. Also, the impedance at the point 506 may be very broad or flat with frequency. The transmission line component 408, represented as a component (j) in FIG. 5, provides a first sub-offset to the summing-point load impedance $Z_x$ such that the summing-point load impedance shifts to a point 508 that is intentionally away from a desired load impedance of the distributed power amplifier. Since capacitively dominant reactance, for example, component (j), is used, the summing-point load impedance moves more capacitively downwards in a clockwise direction when drawn on a 50 ohm Smith Chart, which is away from the ultimately-desired load impedance $Z_{de}$.

Further, the inductive component 410, represented as a component (k), connected in series to the transmission line component 408 provides a second sub-offset to the shifted summing-point load impedance such that a total shifted impedance is now pre-positioned to achieve the desired load impedance of the distributed power amplifier. The second sub-offset moves the summing-point load impedance more inductively upward, in an anti-clockwise direction if drawn on a 50 ohm Smith Chart, to a point 510 in the load plane 502. In one embodiment, the inductive component 410, for example, component (k), provides an inductive contribution to the shift or transformation of the summing-point load impedance $Z_x$ so that the new impedance now moves to an optimal pre-biased location such that further constituent movements, for example, from the point 510 to a point 512, then to a point 514 and back to the point 506, of the on-chip components, represented as components (a), (b), (c), move the resultant driving-point load impedance close to the desired load impedance of the distributed amplifier. Though described for one frequency, the collective set of movements retains the convergent nature at all frequencies. Thus, the off-chip components or IP block, working in conjunction with on-chip components, closely preserve the original Zx in its cumulative transformation to a 'Zd' that is presented to the corresponding power transistor in the distributed amplifier.

Figure 6:
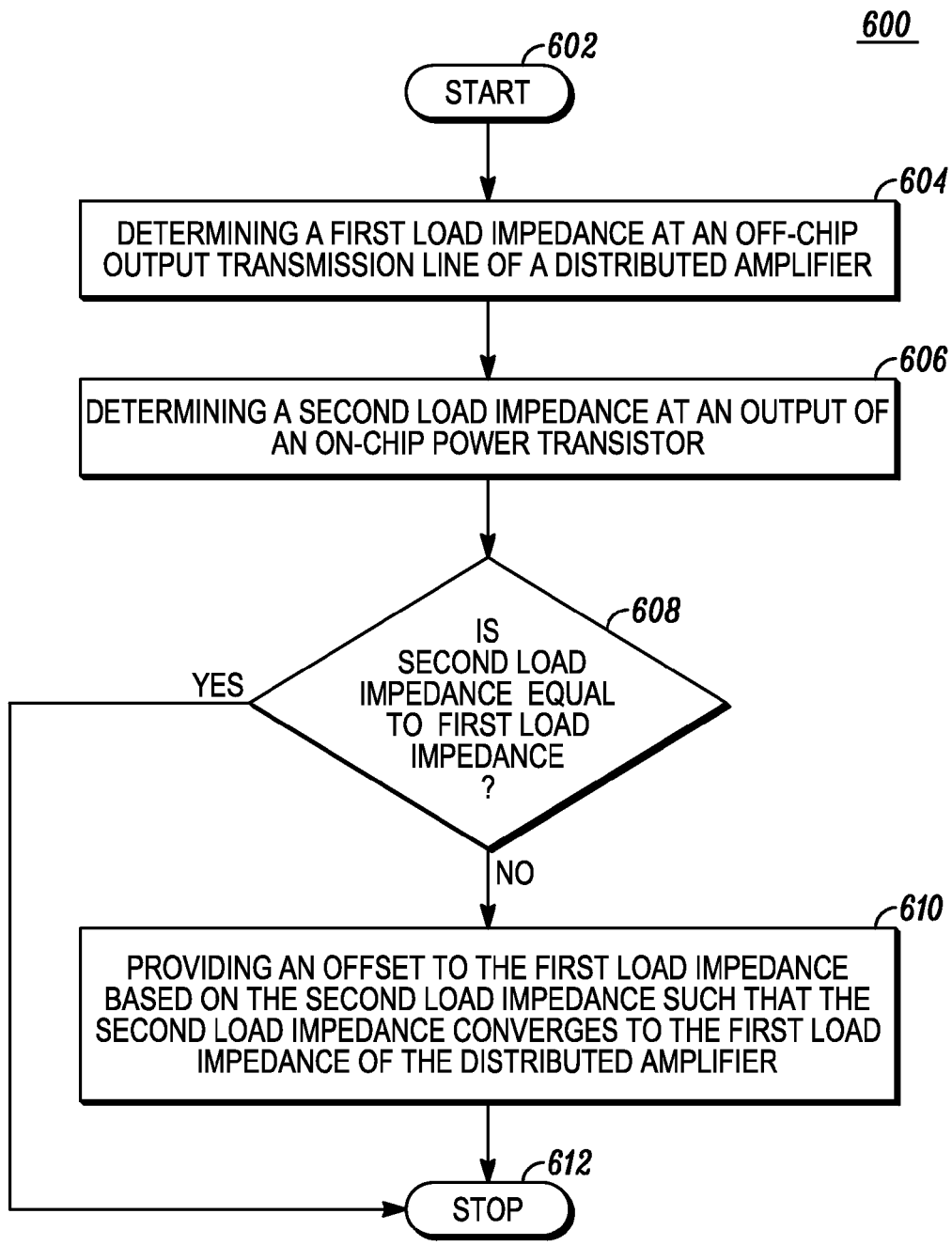
FIG. 6 is a flowchart of a method for adjusting an load impedance at a feed point in a distributed amplifier in accordance with an embodiment of the invention.

FIG. 6 is a flowchart of a method 600 for adjusting a load impedance at a feed point in a distributed amplifier in accordance with an embodiment of the invention. The method 600 starts at 602 with a step of determining 604 a summing-point load impedance $Z_x$ at an off-chip output transmission line of the distributed amplifier. The method 600 then continues with a step of determining 606 a driving-point load impedance $Z_d$ at an output of an on-chip power transistor. In accordance with the embodiment, the driving-point load impedance may spatially diverge and disperse over frequency from the summing-point load impedance due to reactance of at least one on-chip component, such as components 212, 216, 220, coupled to the output of the on-chip power transistor 122. The method 600 then continues with a step of determining 608 whether the driving-point load impedance $Z_d$ is similar to the summing-point load impedance $Z_x$. If the driving-point load impedance $Z_d$ is similar to as the summing-point load impedance $Z_x$ then the method 600 terminates at a step 612.

On the other hand, if the driving-point load impedance $Z_d$ is not adequately converged to the summing-point load impedance $Z_x$, the method continues with a step of providing 610 an offset to the summing-point load impedance $Z_x$ based on the driving-point load impedance $Z_d$ such that the driving-point load impedance $Z_d$ converges to the summing-point load impedance $Z_x$ of the distributed amplifier. The offset is provided by employing off-chip components, such as the transmission line component 408 and the inductive component 410, known as IP block 420 of FIG. 4. The transmission line or mostly-capacitive component 408 provides a first sub-offset to the summing-point load impedance such that the summing-point load impedance shifts away from a desired load impedance of the distributed power amplifier. Similarly, the inductive component 410 provides a second sub-offset to the shifted summing-point load impedance such that a total shifted impedance is pre-positioned to subsequently achieve the desired transistor-driving-point load impedance $Z_d$, within a distributed power amplifier. For example, the on-chip components then operate upon the total shifted impedance of the summing-point load impedance such that the impedance at the driving-point $Z_d$ of the transistor is again re-formed and re-converged over frequency to that of the summing-point load impedance. Thus, the IP block introduces a prior-distortion to those summing-point load impedances that shifts the impedance-set to a pre-positioned locality so that the inherent or constituent contribution of the on-chip components brings the impedance back to a similar positioning as that of the summing-point load impedance at the feed point on the transmission line. Thus, the IP block formed and operating in accordance with the embodiment of the invention supports maintaining a desired loading at the output of the power transistor.

Accordingly, there has been provided a distributed amplifier that can be implemented in a communication device for amplifying broad range of frequencies. The communication device may be a portable communication device, a battery powered portable communication device, a handheld subscriber device, or a vehicular mobile device. Also, the communication device having distributed amplifier may be operated within at least one of a cognitive radio network or a public safety network.

Further, distributed amplifiers may also be implemented in military and medical equipments such as radars, communication, counter measures etc. Because of their broadband nature, they may simply be used as a "one part does it all" amplifier in a general purpose manner, which is an easy way for a manufacturer to buy one part and reduce the number of parts they need to buy from vendors that may operate only in a limited band of frequencies.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A distributed power amplifier comprising:
   an off-chip output transmission line having a first load impedance at a summing junction;
   at least one off-chip component, coupled between the off-chip output transmission line and at least one on-chip component, the at least one on-chip component coupled to an output of a power transistor, wherein the off-chip component provides an offset to the first load impedance such that a second load impedance at an output of a power transistor converges to the first load impedance of the distributed amplifier, the off-chip component including at least one of a transmission line component and an inductive component, the at least one of the transmission line component and a capacitive component providing a first sub-offset to the first load impedance so that the first load impedance diverges away from a desired load impedance of the distributed amplifier; and
   a plurality of sections, each section having a plurality off-chip components coupled to the transmission line, wherein the inductive component provides a second sub-offset to the first load impedance so that the first load impedance moves to an optimized pre-biased location such that constituent movements of the on-chip components move and re-converge the second set of load impedances, over frequency, close to the desired load impedance at each section of the distributed amplifier.

2. The distributed power amplifier of claim 1, wherein the distributed amplifier is an amplifier implemented in a radio frequency (RF) device supporting broad range of frequencies.

3. The distributed power amplifier of claim 1, wherein the distributed amplifier is an amplifier implemented in a communications device.

4. The distributed power amplifier of claim 3, wherein the communication device operates within a cognitive radio network.

5. The distributed power amplifier of claim 3, wherein the communication device operates within a public safety network.

6. The distributed power amplifier of claim 3, wherein the communication device is a portable communication device.

7. The distributed power amplifier of claim 6, wherein the portable communication device is a battery powered portable communication device.

8. The distributed power amplifier of claim 7, wherein the battery powered portable communication device is one or more of a handheld subscriber device and a vehicular mobile device.

9. A method for adjusting load impedance at an output feed point present in a distributed amplifier, the method comprising:
   determining a first load impedance ($Zx$) at an off-chip output transmission line of the distributed amplifier;
   determining a second load impedance ($Zd$) at an output of an on-chip power transistor, wherein the second load impedance diverges and disperses over frequency from the first load impedance due to reactance of at least one on-chip component coupled to the output of the on-chip power transistor; and
   providing an offset to the first load impedance ($Zx$) based on the second load impedance ($Zd$) such that the second load impedance ($Zd$) converges to the first load impedance ($Zx$) of the distributed amplifier, wherein the offset is provided by at least one of: biasing the summing-point load impedance; and pre-distorting the locus of summing-point load impedance.

10. A method for adjusting load impedance at an output feed point present in a distributed amplifier, the method comprising:
    determining a first load impedance ($Zx$) at an off-chip output transmission line of the distributed amplifier;
    determining a second load impedance ($Zd$) at an output of an on-chip power transistor, wherein the second load impedance diverges and disperses over frequency from the first load impedance due to reactance of at least one on-chip component coupled to the output of the on-chip power transistor; and
    providing an offset to the first load impedance ($Zx$) based on the second load impedance ($Zd$) such that the second load impedance ($Zd$) converges to the first load impedance ($Zx$) of the distributed amplifier, wherein providing the offset to the first load impedance ($Zx$) further comprises:
       providing a first sub-offset to the first load impedance such that the first load impedance shifts away from a desired load impedance of the distributed power amplifier; and
       providing a second sub-offset to the shifted first load impedance such that a total shifted impedance is pre-positioned to eventually achieve the desired load impedance presented to a given transistor within the distributed power amplifier.

11. The method of claim 10, wherein the first load impedance is a summing-point load impedance ($Zx$).

12. The method of claim 10, wherein the second load impedance is a driving-point load impedance ($Zd$) of the on-chip power transistor.

* * * * *